US010332781B2

(12) United States Patent
Lottes

(10) Patent No.: US 10,332,781 B2
(45) Date of Patent: Jun. 25, 2019

(54) SYSTEMS AND METHODS FOR PERFORMING EPITAXIAL SMOOTHING PROCESSES ON SEMICONDUCTOR STRUCTURES

(71) Applicants: Charles Robert Lottes, Ballwin, MO (US); SunEdison Semiconductor Limited, Singapore (SG)

(72) Inventor: Charles Robert Lottes, Ballwin, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 27 days.

(21) Appl. No.: 15/537,734

(22) PCT Filed: Dec. 18, 2015

(86) PCT No.: PCT/US2015/066617
§ 371 (c)(1),
(2) Date: Jun. 19, 2017

(87) PCT Pub. No.: WO2016/100792
PCT Pub. Date: Jun. 23, 2016

(65) Prior Publication Data
US 2018/0277423 A1 Sep. 27, 2018

Related U.S. Application Data

(60) Provisional application No. 62/094,466, filed on Dec. 19, 2014.

(51) Int. Cl.
*H01L 21/00* (2006.01)
*H01L 21/762* (2006.01)
(Continued)

(52) U.S. Cl.
CPC .... *H01L 21/76256* (2013.01); *H01L 21/3065* (2013.01); *H01L 21/67115* (2013.01);
(Continued)

(58) Field of Classification Search
CPC ............... H01L 21/76256; H01L 22/26; H01L 21/67115; H01L 21/76254; H01L 22/20; H01L 21/3065; H01L 22/12
(Continued)

(56) References Cited

U.S. PATENT DOCUMENTS 5,254,830 A * 10/1993 Zarowin ........... H01J 37/32935
156/345.24
6,280,645 B1 * 8/2001 Yanagisawa ...... H01J 37/32192
216/38

(Continued)

FOREIGN PATENT DOCUMENTS

WO WO-2013136146 A1 * 9/2013 ....... H01L 21/02238

OTHER PUBLICATIONS

Communication pursuant to Article 94(3) EPC received in EP Patent Application No. 15821242.3, dated Mar. 8, 2019, 7 pages.

*Primary Examiner* — Vu A Vu
(74) *Attorney, Agent, or Firm* — Armstrong Teasdale LLP

(57) ABSTRACT

Systems and methods for processing semiconductor structures are provided. The methods generally include determining a desired removal map profile for a device layer of a semiconductor structure, determining a set of process parameters for use in an epitaxial smoothing process based on the desired removal map profile, and selectively removing material from the device layer by performing an epitaxial smoothing process on an outer surface of the device layer.

17 Claims, 12 Drawing Sheets

(51) Int. Cl.
   *H01L 21/66* (2006.01)
   *H01L 21/3065* (2006.01)
   *H01L 21/67* (2006.01)

(52) U.S. Cl.
   CPC ........ *H01L 21/76254* (2013.01); *H01L 22/12* (2013.01); *H01L 22/20* (2013.01); *H01L 22/26* (2013.01)

(58) Field of Classification Search
   USPC .......................................................... 438/5
   See application file for complete search history.

(56) References Cited

U.S. PATENT DOCUMENTS

| | | | | |
|---|---|---|---|---|
| 6,301,009 | B1* | 10/2001 | Tinker | B24B 37/015 356/511 |
| 2002/0014407 | A1* | 2/2002 | Allen | H01J 37/317 204/298.36 |
| 2004/0060899 | A1* | 4/2004 | Waldhauer | H01L 21/30604 216/2 |
| 2008/0299742 | A1* | 12/2008 | Akiyama | H01L 21/3065 438/458 |

* cited by examiner

SYSTEMS AND METHODS FOR PERFORMING EPITAXIAL SMOOTHING PROCESSES ON SEMICONDUCTOR STRUCTURES

CROSS-REFERENCE TO RELATED APPLICATIONS

This application is a National Stage application of International Application No. PCT/US2015/066617, filed on Dec. 18, 2015, which claims priority to U.S. Provisional Application No. 62/094,466, filed on Dec. 19, 2014, the disclosures of which are hereby incorporated by reference in their entirety.

FIELD

The field of the disclosure relates generally to systems and methods for processing semiconductor structures and, more particularly, to systems and methods for performing epitaxial smoothing processes on silicon-on-insulator structures.

BACKGROUND

Semiconductor wafers are generally prepared from a single crystal ingot (e.g., a silicon ingot) which is then sliced into individual wafers. In some applications, a multi-layered structure (sometimes generically referred to as a multi-layered structure or simply as a wafer) may be used. A common form of multi-layered structure is a semiconductor on insulator structure, one of the most common of which is a silicon-on-insulator (SOI) wafer. An SOI wafer typically includes a thin layer of silicon atop a dielectric layer (i.e., an insulating layer) which is in turn disposed on a substrate (i.e., a handle wafer). Typically the substrate or handle wafer is silicon.

An example process of making an SOI wafer includes depositing a layer of oxide on a polished front surface of a donor wafer. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer may be cleaned to remove organic compounds deposited on the wafer during the implantation process.

The front surface of the donor wafer is then bonded to a handle wafer to form a bonded wafer through a hydrophilic bonding process. In some processes, the donor wafer and the handle wafer are bonded together by exposing the surfaces of the wafers to a plasma containing, for example, oxygen or nitrogen. Exposure to the plasma modifies the structure of the surfaces in a process often referred to as surface activation. The wafers are then pressed together and a bond is formed therebetween. The donor wafer is thereafter separated (i.e., cleaved) along the cleave plane from the bonded wafer to form the SOI wafer.

The resulting SOI wafer comprises a thin layer of silicon (the portion of the donor wafer remaining after cleaving) disposed atop the oxide layer and the handle wafer. The cleaved surface of the thin layer of silicon has a rough surface that is ill-suited for end-use applications. The damage to the surface may be the result of the particle implantation and the resultant dislocations in the crystal structure of the silicon. Accordingly, additional processing is required to smooth the cleaved surface.

Known methods used to smooth and thin the surface layer of silicon (i.e., the cleaved surface) include combinations of annealing, chemical-mechanical polishing, high-temperature gaseous etching (i.e., epitaxial smoothing or "epi-smoothing"), and the formation of a sacrificial oxide layer on the cleaved surface. These smoothing processes are generally carried out using the same process parameters for each SOI wafers. That is, the processing conditions for current smoothing processes are generally not adjusted between SOI wafers within the same batch.

Current fabrication processes for SOI wafers have provided satisfactory thickness uniformity in the top silicon layer for most applications. However, current smoothing processes provide less than optimal thickness uniformities for certain applications, such as extremely thin SOI (ETSOI) applications or applications requiring fully depleted transistor gates, because the thickness uniformity requirements for such applications are sometimes more stringent. For example, industry specifications for partially depleted SOI (PDSOI) applications permit a top layer thickness uniformity of 30 angstroms (Å) or more, while fully depleted SOI (FDSOI) applications require a top layer thickness uniformity of 10 Å or less. Accordingly, a need exists for an SOI wafer processing system and method that enables the production of SOI wafers with silicon layers having improved thickness uniformity.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a method for processing a silicon-on-insulator (SOI) structure is provided. The SOI structure includes a handle wafer, a silicon layer, and a dielectric layer between the handle wafer and the silicon layer. The silicon layer has a cleaved surface defining an outer surface of the SOI structure. The method includes determining a desired removal map profile for the silicon layer of the silicon-on-insulator structure, determining a set of process parameters for use in an epitaxial smoothing process based on the desired removal map profile, and selectively removing material from the silicon layer according to the removal map profile by performing an epitaxial smoothing process on the cleaved surface using the determined set of process parameters.

In another aspect, a system for processing a silicon-on-insulator (SOI) structure is provided. The SOI structure includes a handle wafer, a silicon layer, and a dielectric layer between the handle wafer and the silicon layer. The silicon layer has a cleaved surface defining an outer surface of the structure. The system includes a wafer measuring device configured to measure a thickness profile of the silicon layer, a wafer processing device, and a computing device communicatively connected to the thickness measuring device. The computing device is configured to determine a desired removal map profile for the silicon layer of the SOI structure based on the thickness profile of the silicon layer, and determine a set of process parameters for use in an epitaxial smoothing process based on the desired removal map profile. The wafer processing device is configured to selectively remove material from the silicon layer according to the removal map profile by performing an epitaxial smoothing process on the cleaved surface using the determined set of process parameters.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
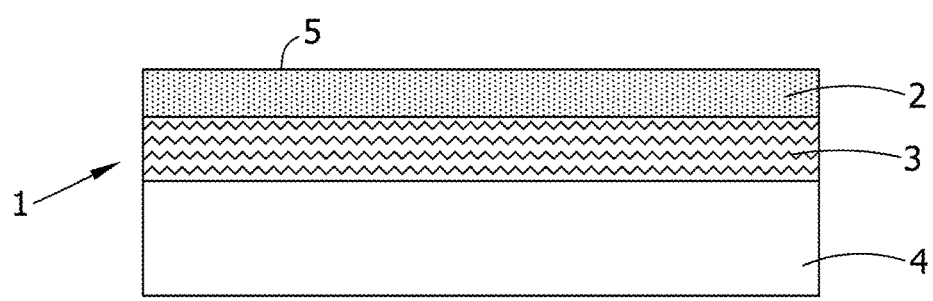
FIG. 1 is a cross-sectional view of an example semiconductor structure shown in the form of a silicon-on-insulator (SOI) structure.

Referring to FIG. 1, a semiconductor layered structure suitable for use in embodiments of the present disclosure is indicated generally at 1. The structure 1 includes a semiconductor layer 2, a dielectric layer 3 (also referred to as an insulating layer), and a substrate 4. The semiconductor layer 2 of the structure is generally the portion upon or in which microelectronic devices are formed. One typical semiconductor layer 2 (also referred to as a device layer) utilized in the present disclosure is silicon. In the example embodiment, the structure 1 is a silicon-on-insulator (SOI) structure having a silicon semiconductor layer 2, and thus, the semiconductor structure 1 is interchangeably referred to herein as an SOI structure, although aspects of the present disclosure are suitable for use with semiconductor structures other than SOI structures. Further, while the semiconductor layer 2 is described throughout the present disclosure as a silicon layer, the semiconductor layer 2 may include other semiconductor layers or multiple layers including, for example and without limitation, silicon, germanium, gallium arsenide, aluminum nitride, silicon germanium, gallium nitride, and combinations thereof.

The substrate 4 (also referred to as a handle wafer) may be any material suitable for forming a layered structure including, for example and without limitation, silicon, germanium, gallium arsenide, aluminum nitride, silicon germanium, gallium nitride, sapphire, and combinations thereof.

The dielectric layer 3 (also referred to as an insulating layer) is disposed between the semiconductor layer 2 and the handle wafer 4. The dielectric layer 3 may be any electrically insulating material suitable for use in a semiconductor-on-insulator structure including, for example and without limitation, $SiO_2$, $Si_3N_4$, aluminum oxide, magnesium oxide, and combinations thereof. Typically, an SOI structure comprises an insulating layer such as $SiO_2$ in part or in whole as the insulating layer.

The layers of the SOI structure 1 may be bonded using any suitable means generally known in the art, including oxidation and/or surface activation. For example, in some embodiments, the SOI structure is bonded through oxidation of the donor wafer, the handle wafer, or both the donor wafer and the handle wafer prior to bonding. In other embodiments, the SOI structure may be bonded by surface activation with dielectric layers on the donor wafer, the handle wafer, or both the donor wafer and the handle wafer.

An example process of making an SOI structure includes depositing a dielectric layer (e.g., an oxide layer) on a polished front surface of a donor wafer. Particles (e.g., hydrogen ions or a combination of hydrogen and helium ions) are implanted at a specified depth beneath the front surface of the donor wafer. The implanted particles form a cleave plane in the donor wafer at the specified depth at which they were implanted. The surface of the donor wafer is cleaned in one or more cleaning operations to remove contaminants (e.g., organic compounds and other contaminant particles) deposited on the wafer during the implantation process.

The front surface of the donor wafer is then bonded to a handle wafer to form a bonded wafer through, for example, a hydrophilic bonding process. In some embodiments, the donor wafer and handle wafer are bonded together by exposing the surfaces of the wafers to a plasma, which modifies the structure of the surfaces in a process often referred to as surface activation. The wafers are then pressed together and a bond is formed therebetween. This bond is typically relatively weak, and may therefore be strengthened prior to cleaving the structure to remove a portion of the donor wafer.

In some processes, the hydrophilic bond between the donor wafer and handle wafer (i.e., a bonded wafer) is strengthened by heating or annealing the bonded wafer pair, to form covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane. A portion of the donor wafer is then separated (i.e., cleaved) along the cleave plane from the bonded wafer to form the SOI structure.

One method for cleaving the donor wafer along the cleave plane includes placing the bonded structure in a fixture in which mechanical force is applied generally perpendicular to the opposing sides of the bonded wafer in order to pull a portion of the donor wafer apart from the bonded wafer. The opposing forces need not be perfectly perpendicular to the opposing sides without departing from the scope of the present application. According to some embodiments, suction cups are utilized to apply the mechanical force. The separation of the portion of the donor wafer can be initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI structure. According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer.

The resulting SOI structure comprises a thin layer of silicon 2 (the portion of the donor wafer remaining after cleaving) disposed atop the dielectric layer 3 and the handle wafer 4. The cleaved surface 5 of the silicon layer 2 defines an outer surface of the SOI structure, and initially has a rough, non-uniform surface. The cleaved surface 5 may be subjected to pre-epitaxial smoothing processes, such as pre-epitaxial smoothing annealing and chemical-mechanical polishing, as well as epitaxial smoothing ("epi-smoothing") processes to obtain a relatively smooth, uniform surface as compared to the initial, unprocessed cleaved surface. In one particular embodiment, the cleaved surface 5 of the silicon layer 2 is subjected to an oxidation layer thinning process (e.g., by oxidizing the cleaved surface 5 and stripping the oxide) followed by a high-temperature anneal process in an argon gas environment and, subsequently, a second oxidation layer thinning step. The silicon layer 2 is then subjected to an epi-smoothing process to thin the silicon layer 2 to a target thickness and improve thickness uniformity.

Semiconductor structures, such as SOI structures, are typically processed in batches. In some instances, the epi-smoothing process is not adjusted between SOI structures within the same batch of SOI structures. Such batch epi-smoothing processes are typically adequate for applications having less stringent within-wafer thickness uniformity requirements, such as applications requiring only a partially-depleted SOI structure. For certain applications, however, it is desirable that the outer silicon layer 2 have a thickness uniformity that may require the epi-smoothing process be adjusted or "tuned" on a wafer-by-wafer basis. For example, industry specifications for some applications, such as applications requiring a fully depleted SOI structure, require a within-wafer thickness uniformity of about 10 Å or less. Such thickness uniformities may require the epi-smoothing process be adjusted or tuned based on an initial thickness profile of the SOI structure being processed.

The systems and methods of the present disclosure facilitate production of semiconductor structures with semiconductor device layers (e.g., silicon layers) having highly uniform thickness profiles. The systems and methods described herein are particularly suitable for use with SOI structures having a silicon layer with a pre-epi-smoothing thickness of between about 100 Å to about 5,000 Å and, more suitably, between about 100 Å and about 1,000 Å. The systems and methods described herein are also suitable for producing SOI structures having a silicon layer with a post-epi-smoothing thickness of between about 100 Å to about 1,000 Å, more suitably, between about 100 Å and 500 Å, and a silicon layer thickness uniformity of about ±10 Å and, more suitably, about ±5 Å. While the systems and methods of the present disclosure are described with reference to SOI wafers, aspects of the disclosure are suitable for use with semiconductor structures other than SOI wafers.

Figure 2:
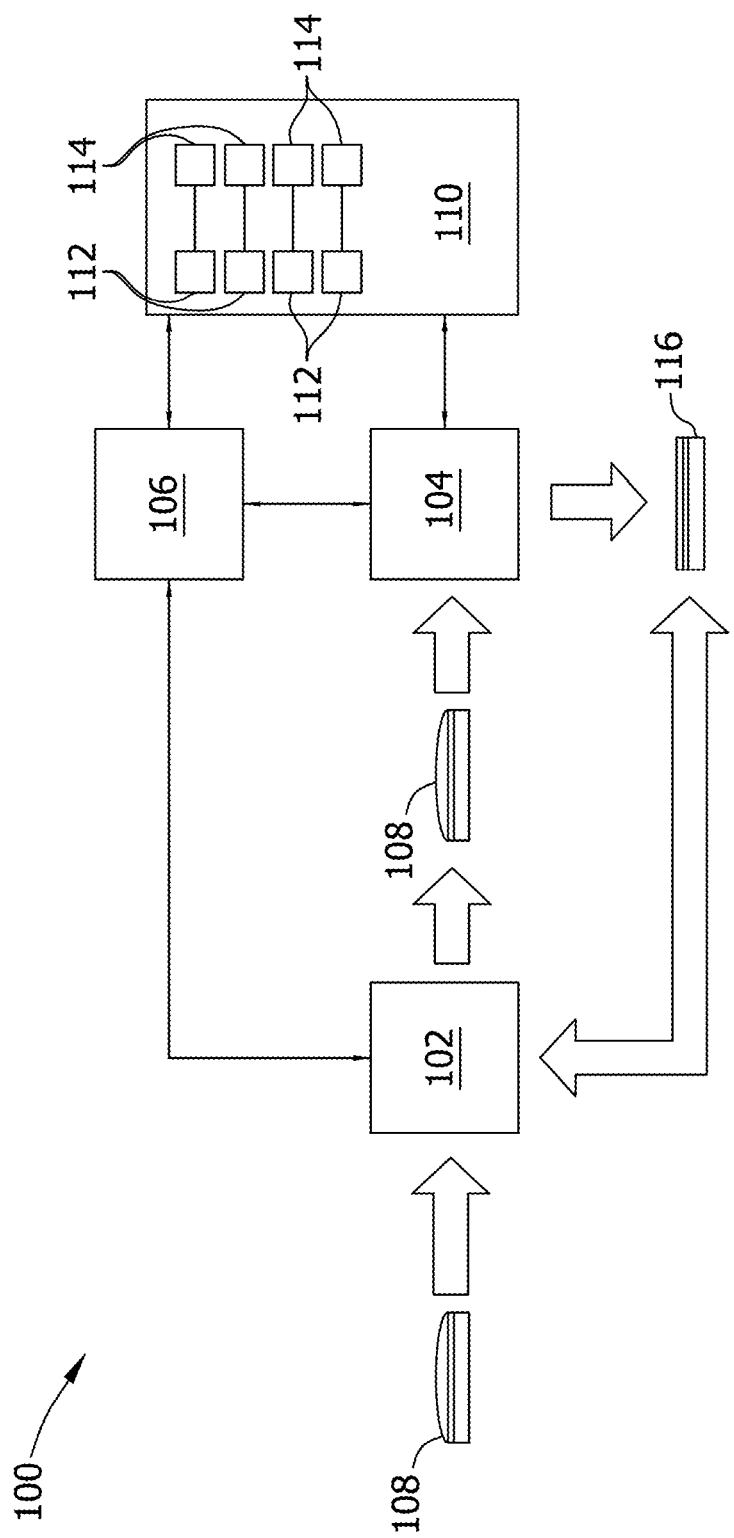
FIG. 2 is a schematic view of a wafer processing system including a wafer processing device and a computing device.

Referring to FIG. 2, a wafer processing system for performing a smoothing process on a semiconductor structure, such as the SOI structure 1 of FIG. 1, is shown schematically and is indicated generally at 100. The example wafer processing system 100 is particularly suited for processing SOI wafers using an epi-smoothing process, although the wafer processing system 100 may be used to process semiconductor structures other than SOI structures, and may be used to perform smoothing processes other than epi-smoothing processes.

The illustrated wafer processing system 100 includes a wafer measuring device 102, a wafer processing device 104, and a computing device 106. The wafer measuring device 102 and the wafer processing device 104 are both communicatively connected to the computing device 106 by any suitable communication system (e.g., a wired and/or wireless network) for sending and receiving information to and from the computing device 106, such as information about an SOI structure or process parameters to be used in processing the SOI structure. In use, the wafer processing system 100 is used to perform an epi-smoothing process on an SOI structure based on a thickness profile of an incoming (i.e., pre-epi-smoothing) SOI structure 108. In particular, a thickness profile of the incoming SOI structure 108 is measured using the wafer measuring device 102, and a removal map profile for the silicon layer 2 (shown in FIG. 1) of the incoming SOI structure 108 is determined using the computing device 106. A set of process parameters, or "recipe", is determined using the computing device 106, and the SOI structure is processed according to the determined set of process parameters using the wafer processing device 104.

The illustrated wafer processing system 100 is a "feed forward" system, including a removal map profile library 110 communicatively connected to the computing device 106 and the wafer processing device 104 by suitable a communication system (e.g., a wired and/or wireless network) for sending and receiving information to and from the computing device 106 and the wafer processing device 104. The removal map profile library 110 includes a plurality of removal map profiles 112 and a plurality of process parameter sets 114, where each process parameter set 114 is associated with one of the removal map profiles 112. More specifically, each process parameter set 114 is designed to achieve a removal map profile on the silicon layer 2 (FIG. 1) of an SOI structure using an epi-smoothing process that substantially matches the removal map profile 112 associated with the process parameter set 114. Thus, under normal operating conditions, an SOI structure processed using a given process parameter set 114 will have a removal map profile that substantially matches the removal map profile 112 associated with the process parameter set.

In the example embodiment, each of the removal map profiles 112 is generally known or determined from previously conducted epi-smoothing processes using the process parameter set 114 associated the removal map profile 112. Thus, the removal map profiles 112 and the process parameter sets are interchangeably referred to herein as pre-determined removal map profiles and pre-determined process parameter sets.

The removal map profile library 110 is configured to store the removal map profiles 112 and the process parameter sets 114 such that the removal map profiles 112 and the process parameter sets 114 can be retrieved, modified, or otherwise accessed by the computing device 106 and/or the wafer processing device 104. The removal map profile library 110 may include any suitable structure that enables the wafer processing system 100 to function as described herein including, for example and without limitation, a processor, a memory device, and other components of the computing device 400 (FIG. 4) described in more detail herein.

The wafer measuring device 102 is configured to measure a thickness profile of the incoming SOI structure 108. The term "thickness profile" refers to the thickness of the top silicon layer 2 (shown in FIG. 1) measured at various points across the silicon layer 2, which provide a representative sample of the overall contour of the cleaved surface 5 (shown in FIG. 1) of the silicon layer 2. The thickness profile of an SOI structure generally includes a plurality of thicknesses of the silicon layer 2, where each thickness is associated with a point along the silicon layer 2 at which the associated thickness was measured. The thickness profile may include any suitable number of thicknesses that enables the wafer processing system to function as described herein. In one embodiment, the thickness profile includes 17 thickness measurements, including four sets of thickness measurements taken at four different radiuses from the center of the silicon layer 2, and one thickness measurement taken at the center of the silicon layer 2.

The wafer measuring device 102 may include any suitable measuring device that enables the wafer processing system 100 to function as described herein. One example of a suitable wafer measuring device for measuring the thickness of top layer silicon in SOI structures is a spectroscopic ellipsometer. Other suitable wafer measuring devices for measuring the thickness of top layer silicon in SOI structures include, for example and without limitation, reflectometry based measuring devices and Fourier Transform Infra-Red (FTIR) spectrometry based measuring devices.

The wafer processing device 104 is configured to remove material from the silicon layer 2 (shown in FIG. 1) of the incoming SOI structure 108 using a non-contact smoothing process. In particular, the wafer processing device 104 is configured to selectively remove material from the silicon layer 2 (shown in FIG. 1) of the SOI structure by performing an epi-smoothing process on the cleaved surface 5 (shown in FIG. 1) using process parameters that are based on a thickness profile of the incoming SOI structure 108.

Figure 3:
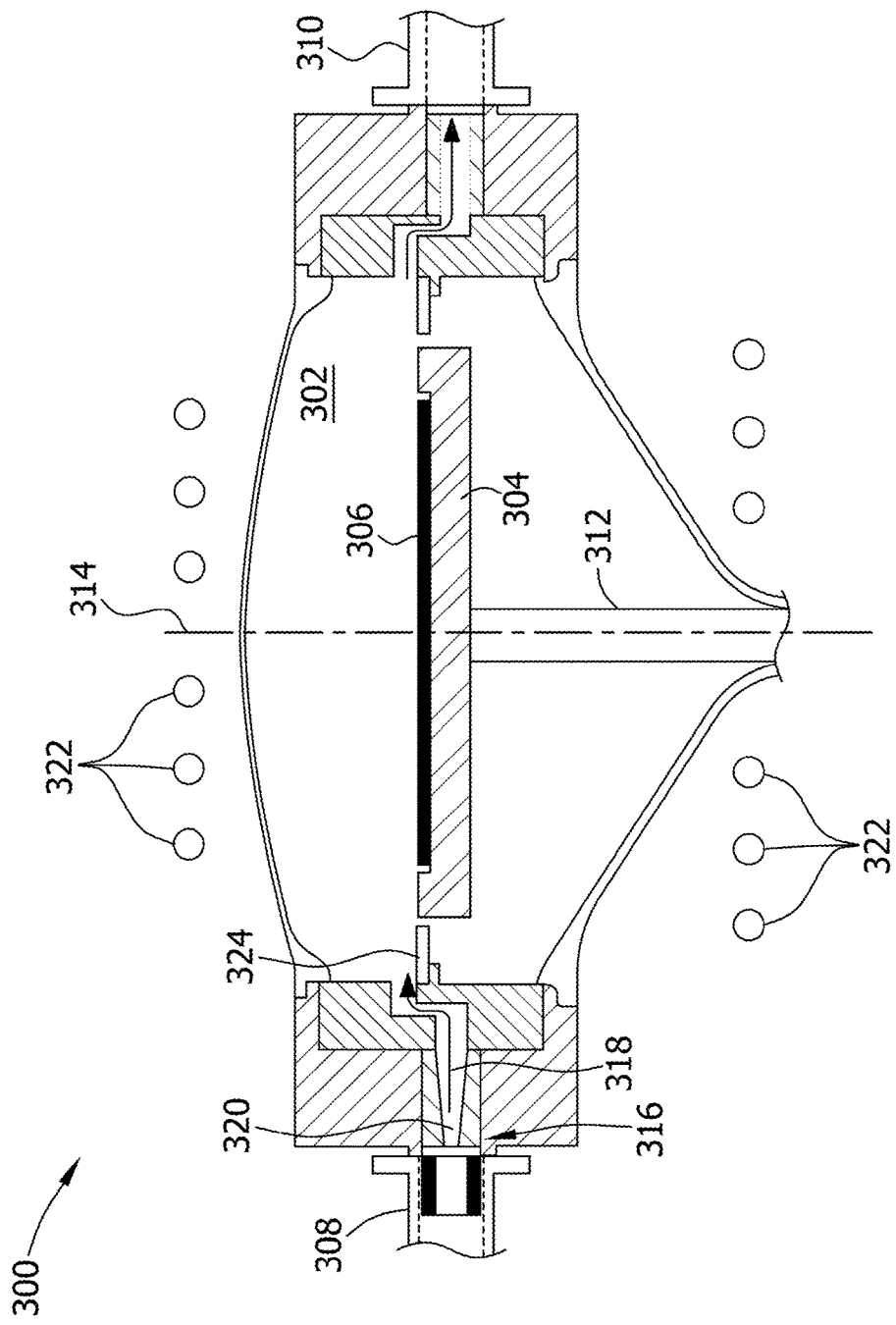
FIG. 3 is cross-section of an example wafer processing device suitable for use with the wafer processing system of FIG. 2, shown in the form of a chemical vapor deposition (CVD) reactor.

FIG. 3 is a schematic cross-section of an example wafer processing device suitable for use with the wafer processing system 100 of FIG. 2, shown in the form of a chemical vapor deposition (CVD) reactor 300. One example of a CVD reactor suitable for use in accordance with the present disclosure is an ASM Epsilon 3000, sold by ASM International. Although the example wafer processing device is described herein with reference to a CVD reactor, the wafer processing device 104 may include wafer processing devices other than CVD reactors.

As shown in FIG. 3, the CVD reactor 300 includes a reaction or processing chamber 302, a rotatable susceptor 304 positioned within the processing chamber 302 and configured to support a substrate 306, such as the SOI structure 1 of FIG. 1, within the processing chamber 302, a gas injection port 308 disposed at one end of the processing chamber 302, and a gas discharge port 310 disposed at an opposite end of the processing chamber 302.

The susceptor 304 is connected to a shaft 312, which is connected to a rotation device (not shown) configured to rotate the shaft 312 and the susceptor 304 about a rotational axis 314. The rotational speed of the susceptor 304 may be controlled using a suitable controller, such as the computing device 106 shown in FIG. 1.

The CVD reactor 300 also includes a gas manifold 316 disposed between the gas injection port 308 and the processing chamber 302. The gas manifold 316 is configured to direct incoming gas 318, such as a gaseous etchant, from the gas injection port 308 into the processing chamber 302. In some embodiments, the gas manifold 316 may define a plurality of gas injection flow paths 320, one of which is shown in FIG. 3, for controlling the distribution of gases within the processing chamber 302. In some embodiments, the gas injection port 308 may be a multi-port injector including two or more separate process lines (not shown), each of which is connected in fluid communication with a process gas source (not shown), such as a source of gaseous etchant or a hydrogen gas source. The process lines may be connected to the same process gas source or different process gas sources. Each of the process lines is connected in fluid communication with one of the gas injection flow paths 320 so as to create multiple gas injection flow zones in the gas manifold 316. The compositions and flow rates of the process gases in the different flow zones may be varied and controlled independently from one another using a suitable controller, such as the computing device 106 of FIG. 1, to control the radial flow distribution of gases over the substrate 306 and, consequently, the relative etch rate of substrate surface.

The CVD reactor 300 also includes a plurality of heating elements 322 configured to heat the substrate 306 and/or gases 318 being fed into the processing chamber 302. In one embodiment, the heating elements 322 include high intensity radiant heat lamps configured to heat the susceptor 304 and/or other thermal-radiation absorbing elements of the CVD reactor 300, such as a preheat ring 324 and/or the susceptor 304. Heat absorbed by the susceptor 304 and the preheat ring 324 is transferred to incoming gases 318 as the gases 318 pass over the preheat ring 324 and the susceptor 304. In other embodiments, the heating elements 322 may include equipment other than high intensity radiant heat lamps including, for example and without limitation, resistance heaters and inductive heaters.

Referring again to FIG. 1, the computing device 106 is communicatively connected to each of the wafer measuring device 102, the wafer processing device 104, and the removal map profile library 110, and is configured to send and/or receive information to and/or from the wafer measuring device 102, the wafer processing device 104, and the removal map profile library 110 to facilitate processing SOI structures with the wafer processing system 100. In some embodiments, for example the computing device 106 may be configured to control components of the wafer processing device 104, such as the susceptor 304, the gas injection port 308, and the heating elements 322, according to a set of process parameters selected or input by a user.

In some embodiments, the computing device 106 may be configured to transmit a set of process parameters to the wafer processing device 104, and the wafer processing device 104 may include an integrated controller configured to control components of the wafer processing device 104 according to the transmitted set of process parameters. In other embodiments, the computing device 106 may be integrated into the wafer processing device 104, and configured to control components of the wafer processing device 104.

In some embodiments, the computing device 106 may be configured to receive information about an incoming SOI structure 108 from the wafer measuring device 102, such as a thickness profile of the silicon layer 2 of the incoming SOI structure 108 or a processed SOI structure 116. The computing device 106 may also be configured to determine a set of process parameters for use in performing an epi-smoothing process on the SOI structure based on the information received from the wafer measuring device 102. In some embodiments, for example, the computing device 106 may be configured to determine a desired removal map profile for the incoming SOI structure 108 based on the initial thickness profile of the incoming SOI structure 108, where the removal map profile represents the amount of material to be removed from the silicon layer 2 at different locations across the silicon layer 2, and determine a set of process parameters based on the desired removal map profile. In some embodiments, the computing device 106 may be configured to identify a removal map profile 112 from the removal map profile library 110 that substantially matches the desired removal map profile for the incoming SOI structure 108, and select the process parameter set 114 associated with the identified removal map profile for use in performing an epi-smoothing process on the SOI structure.

In some embodiments, the computing device 106 may be configured to initiate an update event based on a comparison of the actual thickness profile of a processed SOI structure 116 (i.e., the thickness profile after the epi-smoothing process) and an expected thickness profile of the processed SOI structure 116 (e.g., based on the removal map profile 112 associated with a process parameter set 114 used to process the SOI structure). In one embodiment, for example, the computing device 106 may be configured to output a notification or alert to a user of the wafer processing system 100 if the differences between the actual thickness profile and the expected thickness profile exceeds one or more threshold limits. The threshold limits may be absolute or fixed limits (e.g., an average wafer thickness differential that corresponds to wafer specification requirements) or threshold limits based on, for example, tracking the etch rate at a plurality of points on the wafer and analyzing the data according to statistical process control parameters using decision rules, such as Western Electric rules. When the computing device 106 outputs a notification or alert to the user, the user may then evaluate the SOI structure and/or the processing history of the wafer processing device 104 used to process the SOI structure to determine if the wafer processing device 104 requires maintenance and/or if the removal map profile library 110 should be updated.

In other embodiments, the computing device 106 may be configured to automatically modify or update the removal map profile library 110 by storing a new removal map profile and/or a processing parameter set in the removal map profile library 110 or by modifying one or more of the removal map profiles 112 and the process parameter sets 114. In some embodiments, for example, the computing device 106 may be configured to compare an actual post-epi-smoothing thickness profile of a processed SOI structure 116 with an expected post-epi-smoothing thickness profile (e.g., based on the removal map profile 112 associated with a process parameter set 114 used to process the SOI structure), and replace or modify the removal map profile 112 associated with the process parameter set 114 used to process the SOI structure where the differences between the expected thickness profile and the actual thickness profile exceed one or more threshold limits. For example, where the differences between the expected thickness profile and the actual thickness profile exceed the one or more threshold limits, the computing device 106 may be configured to determine a new removal map profile (e.g., based on pre- and post-epi-smoothing thickness profiles of the SOI structure), and store the new removal map profile in the removal map profile library 110 such that the new removal map profile is associated with the process parameter set used to process the SOI structure.

Additionally or alternatively, the computing device 106 may be configured to initiate an update event based on a comparison of an expected removal map profile and an actual removal map profile for an SOI structure. In some embodiments, for example, the computing device 106 may be configured to determine an actual removal map profile for the processed SOI structure 116 (e.g., based on pre- and post-epi-smoothing thickness profiles of the SOI structure), compare the actual removal map profile to the removal map profile 112 associated with the process parameter set 114 used for the epi-smoothing process, and replace or update the removal map profile 112 in the removal map profile library 110 with the actual removal map profile where the differences between the expected removal map profile and the actual removal map profile exceed one or more threshold limits.

Additionally, the computing device 106 may be configured to analyze or track the calculated differences between the actual thickness profile and the expected thickness profile for multiple SOI structures processed with the wafer processing system 100, and estimate or predict future maintenance requirements of the wafer processing device 106 using, for example, statistical process control.

Although a single computing device 106 is shown in FIG. 2, the wafer processing system 100 may include any suitable number of computing devices that enable the wafer processing system 100 to function as described herein. Further, while the illustrated computing device 106 is shown as separate from the wafer measuring device 102, the wafer processing device 104, and the removal map profile library 110, one or more computing devices may be integrated into one or more of the wafer measuring device 102, the wafer processing device 104, and the removal map profile library 110.

Figure 4:
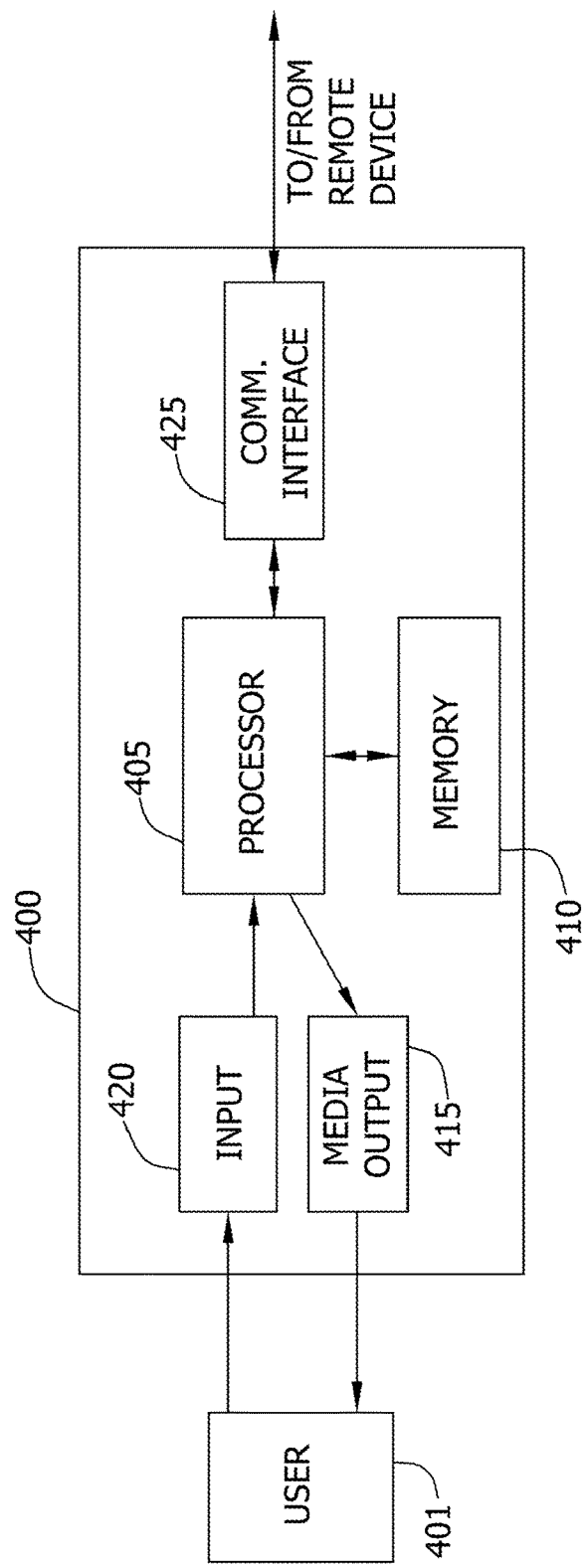
FIG. 4 is block diagram of an example computing device suitable for use with the wafer processing system of FIG. 1.

FIG. 4 is a block diagram of an example embodiment of a computing device 400 suitable for use with the wafer processing system 100 of FIG. 2. For example, computing device 400 is representative of the computing device 106 shown and described above with reference to FIG. 2. Wafer measuring device 102, wafer processing device 104, and removal map profile library 110 may include all or a subset of the components of the computing device 400. The computing device 400 includes a processor 405 for executing instructions. In some embodiments, executable instructions are stored in a memory area 410. The processor 405 may include one or more processing units (e.g., in a multi-core configuration). The memory area 410 is any device allowing information such as executable instructions and/or data to be stored and retrieved. The memory area 410 may include one or more computer readable storage devices or other computer readable media, including transitory and non-transitory computer readable media.

In at least some implementations, the computing device 400 also includes at least one media output component 415 for presenting information to a user 401. The media output component 415 is any component capable of conveying information to the user 401. In some embodiments, the media output component 415 includes an output adapter such as a video adapter and/or an audio adapter. An output adapter is operatively connected to the processor 405 and operatively connectable to an output device such as a display device (e.g., a liquid crystal display (LCD), organic light emitting diode (OLED) display, cathode ray tube (CRT), or "electronic ink" display) or an audio output device (e.g., a speaker or headphones). In some embodiments, at least one such display device and/or audio device is included in the media output component 415.

In some embodiments, the computing device 400 includes an input device 420 for receiving input from the user 401. The input device 420 may include, for example, a keyboard, a pointing device, a mouse, a stylus, a touch sensitive panel (e.g., a touch pad or a touch screen), a gyroscope, an accelerometer, a position detector, or an audio input device. A single component such as a touch screen may function as both an output device of the media output component 415 and the input device 420.

The computing device 400 may also include a communication interface 425, which may be communicatively connected to one or more remote devices, such as the wafer measuring device 102, the wafer processing device 104, and/or the removal map profile library 110. The communication interface 425 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in the memory area 410 are, for example, processor-executable instructions for providing a user interface to the user 401 via media output component 415 and, optionally, receiving and processing input from the input device 420. The memory area 410 may include, but is not limited to, any computer-operated hardware suitable for storing and/or retrieving processor-executable instructions and/or data. The memory area 410 may include random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Further, the memory area 410 may include multiple storage units such as hard disks or solid state disks in a redundant array of inexpensive disks (RAID) configuration. The memory area 410 may include a storage area network (SAN) and/or a network attached storage (NAS) system. In some embodiments, the memory area 410 includes memory that is integrated in the computing device 400. For example, the computing device 400 may include one or more hard disk drives as the memory area 410. The memory area 410 may also include memory that is external to the computing device 400 and may be accessed by a plurality of computing devices. The above memory types are exemplary only, and are thus not limiting as to the types of memory usable for storage of processor-executable instructions and/or data.

Referring again to FIGS. 1-3, to perform an epi-smoothing process on the incoming SOI structure 108, the SOI structure is positioned on the susceptor 304 within the processing chamber 302 with the cleaved surface 5 (FIG. 1) facing upwards such that the cleaved surface 5 is exposed to process gas 318 during the epi-smoothing process. The temperature within the reactor is then set to a desired processing temperature using the heating elements 322. According to some embodiments, the epi-smoothing process is carried out at a processing temperature of between about 900° C. and about 1050° C.

Next, the flow of process gases into the processing chamber 302 is initiated. According to some embodiments, the flow of process gases is initiated immediately after the SOI structure is inserted in the reactor. In these embodiments, the temperature of the reactor is already set at the proper temperature to ensure that the etching reaction is carried out at the desired processing temperature.

The process gases include at least one gaseous etchant. The gaseous etchant may be a mixture of hydrogen chloride gas (HCl), chlorine gas ($Cl_2$), and hydrogen gas ($H_2$). The process gases may also include a carrier gas, such as $H_2$. In one suitable embodiment, HCl is used as the gaseous etchant and $H_2$ is used as a carrier gas for the etchant. The absolute and relative flow rates of each process gas may be controlled using a suitable controller to control the uniformity of the etch rate across the cleaved surface 5.

The flow of gaseous etchant into the CVD reactor 300 then continues for a period of time. The length of the period of time may be determined based on the amount of silicon to be removed from the cleaved surface 5 of the SOI structure 1 and the rate at which the silicon is being etched. For example, if the rate of etching is 3.0 Å/sec and the amount of silicon to be removed is 900 Å, then the flow of gaseous etchant into the CVD reactor 300 will be stopped approximately 300 seconds after the flow of gaseous etchant was initiated.

During the epi-smoothing process, the susceptor 304 is rotated at a desired rotation speed to provide a more uniform etch rate across the cleaved surface 5 of the SOI structure. According to some embodiments, the susceptor is rotated at a rotation speed of between about 10 revolutions per minute (RPM) and about 40 RPM.

Once the epi-smoothing process is completed, the SOI structure is removed from the CVD reactor 300. The processed SOI structure 116 may then be further processed or used for device fabrication.

The epi-smoothing process results in material being removed from the silicon layer 2 according to a removal map profile. The removal map profile associated with a particular epi-smoothing process represents the amount of material removed from the silicon layer 2 at different locations across the cleaved surface 5 of the silicon layer 2. Epi-smoothing processes are generally associated with characteristic removal map profiles, including a concave removal map profile, a convex removal map profile, an "M"-shaped profile where the etch rate is higher at the edges and center of the silicon layer 2, and a "W"-shaped profile where the etch rate is lower at the edges and center of the silicon layer 2. Epi-smoothing processes may have other characteristic removal map profiles depending upon, for example, the reactor in which the epi-smoothing process is carried out.

Figure 5:
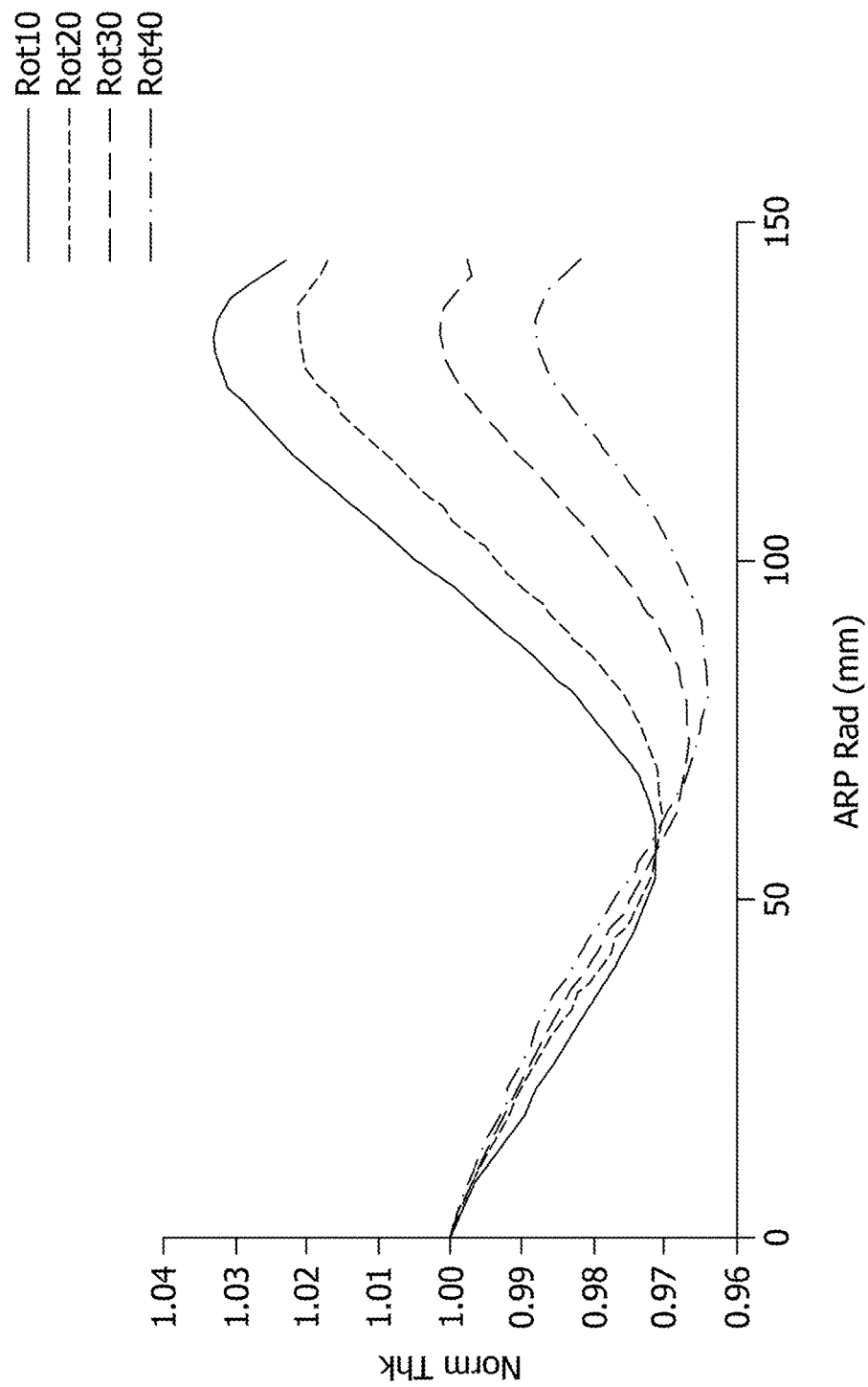
FIGS. 5-8 are charts showing characteristic removal map profiles for the silicon layer of a SOI structure.
Figure 6:
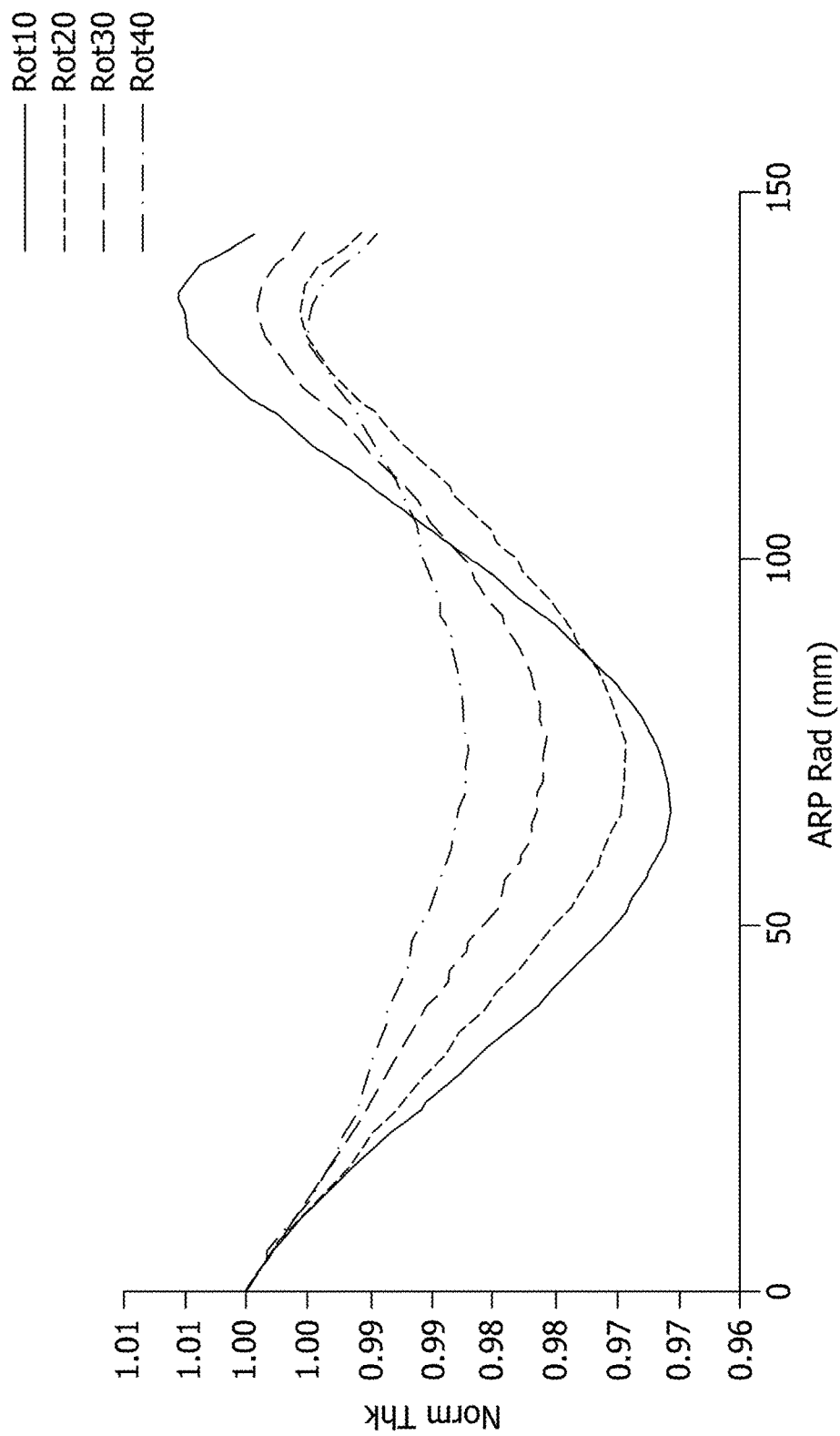
Figure 7:
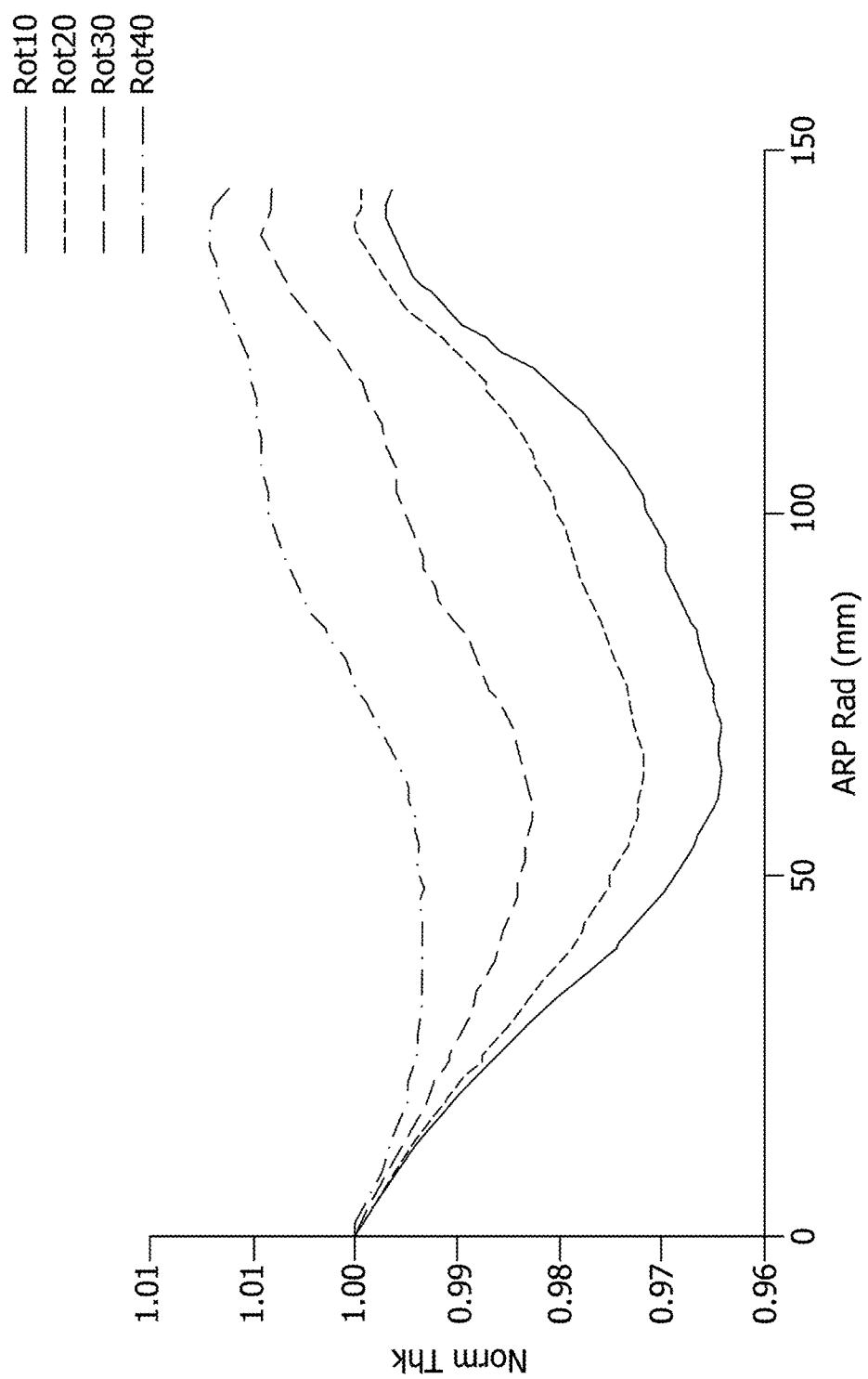
Figure 8:
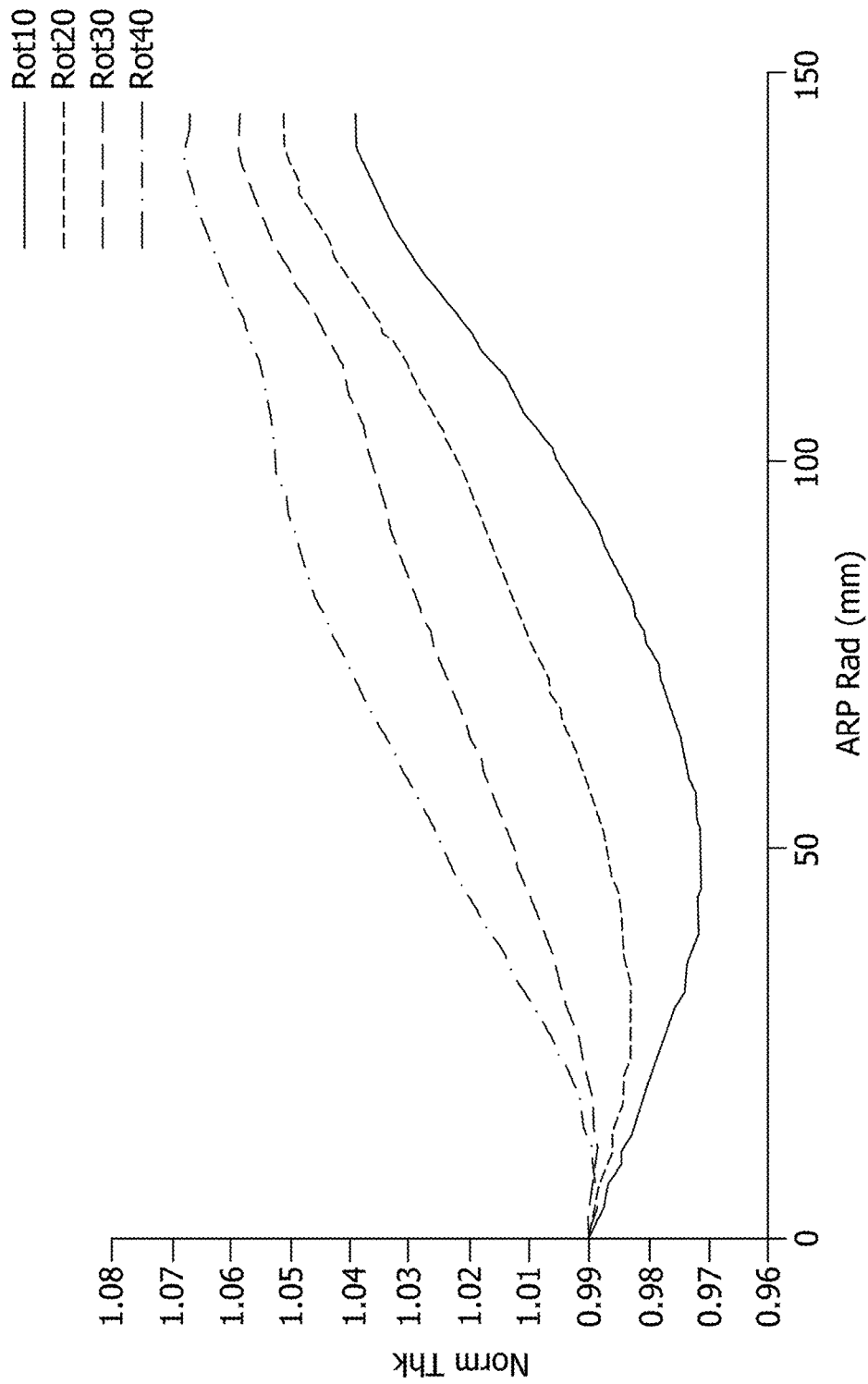

FIGS. 5-8 are charts showing different characteristic removal map profiles for epi-smoothing processes carried out at different process gas flow rates and different susceptor rotation speeds. More specifically, each chart shows the amount of silicon removed from the top silicon layer of four different SOI structures and normalized based on the thickness at the center of the respective silicon layer. Each chart shows the normalized silicon removal as a function of the radial distance from the center of the respective silicon layer. Each of the charts illustrated in FIGS. 5-8 shows the normalized silicon removal for four SOI structures processed at different susceptor rotation speeds and the same process gas flow rate. The four susceptor rotation speeds depicted by the charts shown in FIGS. 5-8 are 10 RPM, 20 RPM, 30 RPM, and 40 RPM. FIG. 5 shows the removal map profiles for SOI structures processed using a process gas flow rate of 80 standard-liters per minute (sl/m), FIG. 6 shows the removal map profiles for SOI structures processed using a process gas flow rate of 100 sl/m, FIG. 7 shows the removal map profiles for SOI structures processed using a process gas flow rate of 120 sl/m, and FIG. 8 shows the removal map profiles for SOI structures processed using a process gas flow rate of 140 sl/m.

As indicated in FIGS. 5-8, variations in the process parameters used to process SOI structures result in different removal map profiles for the SOI structures. The systems and methods described herein facilitate improving the thickness uniformity of SOI structures by adjusting or "tuning" epi-smoothing process parameters to obtain a desired removal map profile for an SOI structure. In some embodiments, for example, the systems and methods described herein enable the process parameters of the epi-smoothing process to be adjusted to obtain a removal map profile that is complementary to the pre-epi-smoothing thickness profile of the silicon layer 2 such that the resulting (i.e., post-epi-smoothing) thickness profile of the silicon layer is substantially uniform (e.g., a within-wafer thickness uniformity of ±5 Å). As described in more detail herein, the systems and methods described herein facilitate determining the removal map profile to be applied to an SOI structure, and determining a set of process parameters to be used in an epi-smoothing process to achieve the desired removal map profile.

Figure 9:
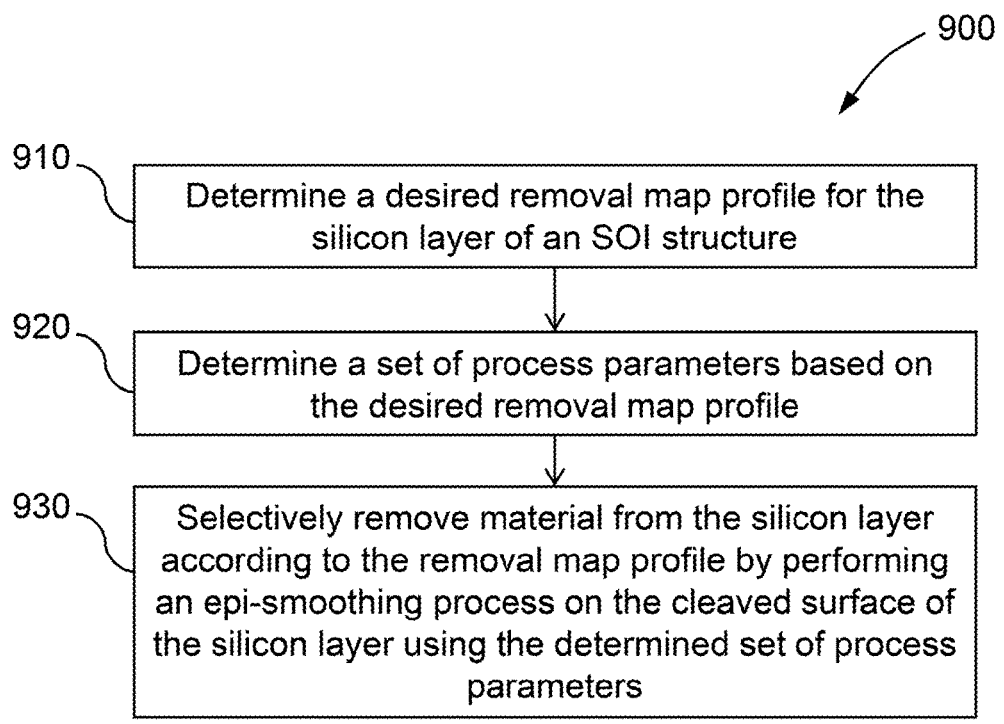
FIG. 9 is a flow chart of an example method for processing the SOI structure of FIG. 1.

FIG. 9 is a flow chart of an example method 900 for processing the SOI structure 1 shown in FIG. 1. The method 900 generally includes determining 910 a desired removal map profile for the silicon layer 2 of the SOI structure 1, determining 920 a set of process parameters for use in an epi-smoothing process based on the desired removal map profile, and selectively removing 930 material from the silicon layer 2 according to the desired removal map profile by performing an epi-smoothing process on the cleaved surface 5 using the determined set of process parameters.

In some embodiments, determining 910 a desired removal map profile for the silicon layer 2 of the SOI structure 1 includes determining a removal map profile that is complementary to an initial thickness profile (i.e., a pre-epi-smoothing thickness profile) of the silicon layer. Referring to FIG. 2, for example, the initial thickness profile of an incoming SOI structure 108 may be determined using the wafer measuring device 102 of the wafer processing system 100. Determining the initial thickness profile of an incoming SOI structure may include measuring the thickness of the top silicon layer 2 (FIG. 1) at a plurality of points along the silicon layer. In one particular embodiment, the thickness of the silicon layer is measured at 17 different points, including at the center of the silicon layer and at four different radial distances from the center of the silicon layer. The desired removal map profile may then be determined based on the initial thickness profile of the incoming SOI structure 108 such that the desired removal map profile is complementary to the initial thickness profile of the incoming SOI structure 108.

In other embodiments, the desired removal map profile for the silicon layer 2 of the SOI structure 1 may be determined based on one or more post-epi-smoothing processes that have a known or predictable effect on the thickness uniformity of the SOI structure, such that the final SOI structure has a substantially uniform thickness. For example, the desired removal map profile may be determined such that the resulting post-epi-smoothing thickness profile of the SOI structure is complementary to a removal map profile of a post-epi-smoothing process. Thus, the epi-smoothing process may be used to accurately control the final thickness uniformity of an SOI structure, even when one or more processes are carried out on the SOI structure after the epi-smoothing process.

Determining 920 a set of process parameters based on the desired removal map profile generally includes determining process parameters for an epi-smoothing process that will result in material being removed from the silicon layer 2 of the SOI structure 1 according to the desired removal map profile. Process parameters that affect the uniformity of the removal rate across the silicon layer 2, and thus, the removal map profile, include, for example and without limitation, absolute and relative process gas flow rates, susceptor rotation speed, the purge flow rate of the processing chamber in which the SOI structure is processed, and the height of the susceptor used to process the SOI structure relative to the SOI structure. Other process parameters that affect the removal map profile for epi-smoothing processes include the relative position of the SOI structure on the susceptor relative to the rotational axis of the susceptor, and the processing temperature at which the epi-smoothing process is carried out. Thus, the set of process parameters may include a gaseous etchant (e.g., HCl) flow rate, a carrier gas (e.g., $H_2$) flow rate, a relative gas flow rate through each of a plurality of gas injection flow paths, such as the gas injection flow paths 320 of FIG. 3, a susceptor rotation speed, a relative position of the SOI structure relative to the rotational axis of the susceptor, a processing temperature, a purge flow rate, and a height of the susceptor relative to the SOI structure.

According to some embodiments, the set of process parameters for a desired removal map profile is determined by trial-and-error. Specifically, epi-smoothing processes are performed on test wafers using different sets of process parameters until the desired removal map profile is obtained on one of the test wafers. Process parameters may be varied based on one's general knowledge and skill in the art, or process parameters may be varied using systematic methods, such as experimental design theory. The test wafers used may include silicon wafers having substantially the same dimensions (i.e., thickness and diameter) as the silicon layer of the incoming SOI structure 108, or the test wafers may be SOI structures substantially identical to the incoming SOI structure 108. In other embodiments, determining 920 a set of process parameters may include selecting a process parameter set from a plurality of pre-determined process parameter sets stored in a removal map profile library, such as the removal map profile library 110, where each pre-determined process parameter set is associated with a pre-determined removal map profile (see, e.g., FIG. 10).

Once the set of process parameters for the desired removal map profile is determined, the SOI structure is processed using the determined set of process parameters. In particular, material from the silicon layer is selectively removed 930 according to the desired removal map profile by performing an epi-smoothing process on the cleaved surface using the determined set of process parameters. The epi-smoothing process may be carried out in the CVD reactor 300 of FIG. 3.

The process parameters used during the epi-smoothing process are set and/or controlled according to the determined set of process parameters. Thus, selectively removing material from the silicon layer of the SOI structure may include controlling the flow rate of a gaseous etchant (e.g., HCl), controlling the flow rate of a carrier gas (e.g., $H_2$), controlling the relative gas flow rate through a plurality of gas injection flow paths, controlling the purge flow rate of the processing chamber of a CVD reactor, controlling a susceptor rotation speed, positioning the SOI structure on a susceptor at a relative position to the rotational axis of the susceptor, and controlling the process temperature of the epi-smoothing process. The process parameters and the components of the CVD reactor in which the epi-smoothing process is performed may be controlled using any suitable controller including, for example and without limitation, the computing device 106 (FIG. 2).

Figure 10:
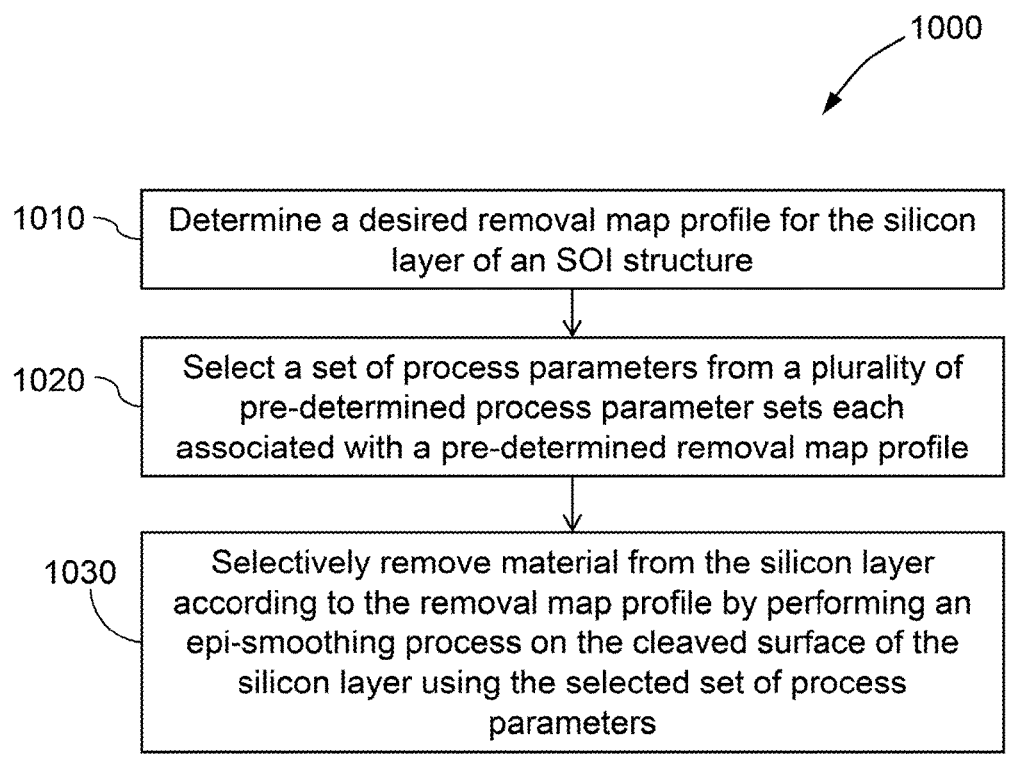
FIG. 10 is a flow chart of another example method for processing the SOI structure of FIG. 1.

FIG. 10 is a flow chart of an example method 1000 for processing the SOI structure 1 of FIG. 1. The method 1000 generally includes determining 1010 a desired removal map profile for the silicon layer 2 of the SOI structure 1, selecting 1020 a set of process parameters from a plurality of pre-determined process parameter sets, each pre-determined process parameter set associated with a pre-determined removal map profile, and selectively removing 1030 material from the silicon layer 2 according to the desired removal map profile by performing an epi-smoothing process on the cleaved surface 5 using the selected set of process parameters.

The steps of determining 1010 a desired removal map profile and selectively removing 1030 material from the silicon layer may be carried out in substantially the same manner as described above with reference to FIG. 9.

In some embodiments, selecting 1020 a set of process parameters includes selecting a process parameter set from a library or database including a plurality of pre-determined process parameter sets, such as the removal map profile library 110 of the wafer processing system 100 (both shown in FIG. 2). The set of process parameters may be selected automatically using a suitable computing device, such as the computing device 106 (FIG. 2), based on the desired removal map profile. For example, once the desired removal map profile is determined 1010, the computing device 106 may automatically identify one of the removal map profiles 112 from the removal map profile library 110 that substantially matches the desired removal map profile. The computing device 106 may then select the process parameter set 114 that corresponds to the removal map profile 112, and transmit the selected process parameter set to wafer processing device 104 for performing the epi-smoothing process. The process parameter set may be transmitted directly to the wafer processing device 104 from the removal map profile library 110, or the process parameter set may be transmitted to the wafer processing device 104 via the computing device 106.

In some embodiments, the removal map profile library 110 is built by performing epi-smoothing processes on a plurality of test wafers using different sets of process parameters for each test wafer. In particular, the pre-epi-smoothing thickness profile of each test wafer is measured using, for example, the wafer measuring device 102 of FIG. 2. An epi-smoothing process is then performed on each test wafer using a specific set of process parameters. The post-epi smoothing thickness profile of each test wafer is measured following the epi-smoothing process, and the removal map profile associated with the set of process parameters used on the test wafer is determined based on the difference between the pre-epi-smoothing thickness profile and the post-epi-smoothing thickness profile of the test wafer. The removal map profile and the associated set of process parameters for each test wafer are then stored in the removal map profile library, and are associated with one another in the removal map profile library. The process parameters used on different test wafers are varied to obtain a variety of different removal map profiles. The process parameters may be varied using any suitable method including, for example and without limitation, experimental design theory.

Figure 11:
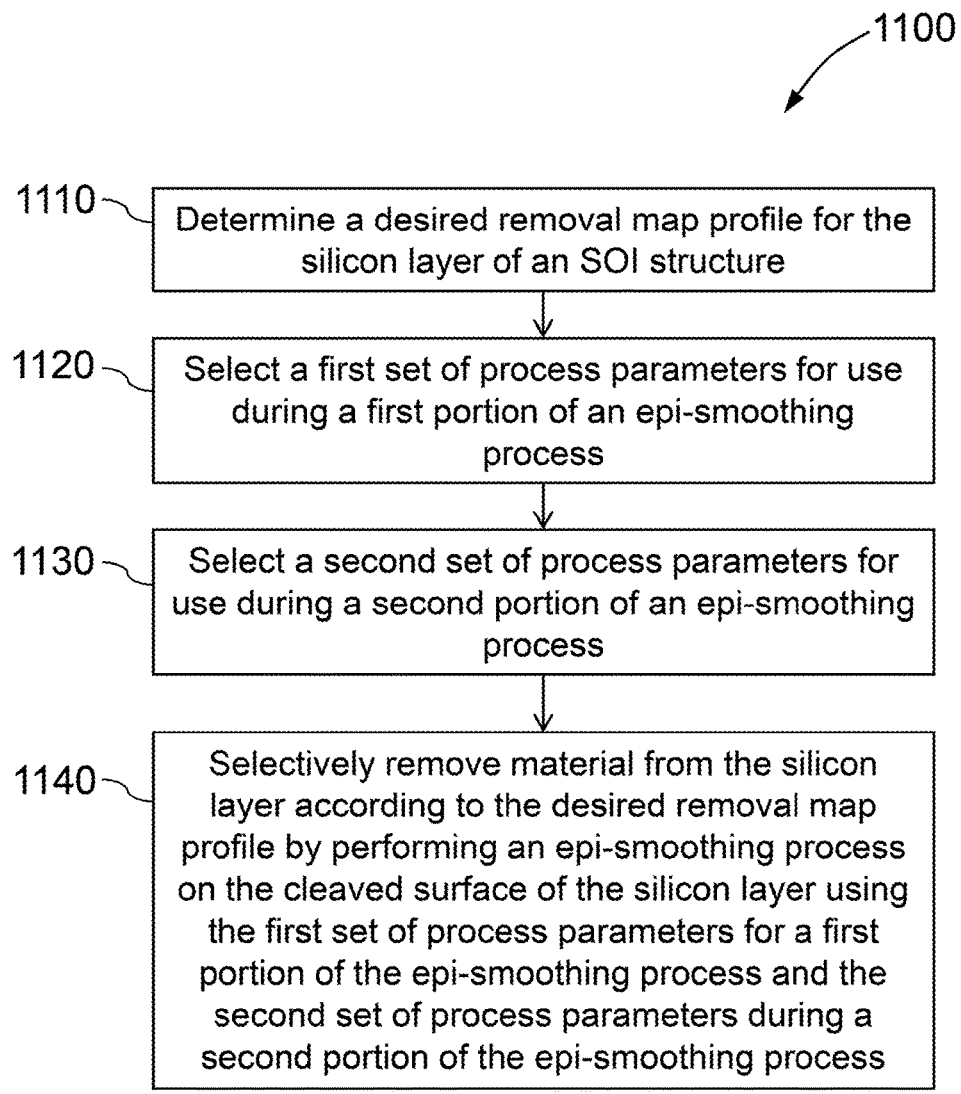
FIG. 11 is a flow chart of another example method for processing the SOI structure of FIG. 1.

FIG. 11 is a flow chart of an example method 1100 for processing the SOI structure 1 of FIG. 1. The method 1100 generally includes determining 1110 a desired removal map profile for the silicon layer 2 of the SOI structure 1, selecting 1120 a first set of process parameters associated with a first removal map profile to be used during a first portion of an epi-smoothing process, selecting 1130 a second set of process parameters associated with a second removal map profile to be used during a second portion of the epi-smoothing process, and selectively removing 1140 material from the silicon layer 2 according to the desired removal map profile by performing the epi-smoothing process on the cleaved surface 5 using the first set of process parameters for the first portion of the epi-smoothing process and the second set of process parameters during the second portion of the epi-smoothing process.

The method 1100 of FIG. 11 is particularly suitable for use where a library from which sets of process parameters are selected (e.g., the removal map profile library 110 of FIG. 2) does not include a removal map profile that substantially matches the desired removal map profile. In particular, the method 1100 of FIG. 11 combines two or more pre-determined process parameter sets into a single epi-smoothing process, a process also referred to herein as "multi-set processing," to achieve a desired removal map profile where the removal map profile library does not include a removal map profile that substantially matches the desired removal map profile.

In some embodiments, for example, selecting 1120 a first set of process parameters and selecting 1130 a second set of process parameters each include selecting a set of process parameters from a plurality pre-determined process parameter sets, where each pre-determined process parameter set is associated with a pre-determined removal map profile. The pre-determined process parameter sets and the removal map profiles may be stored, for example, in a library, such as the removal map profile library 110 (FIG. 2).

The first and second sets of process parameters are selected based on the desired removal map profile and each pre-determined removal map profile associated with the respective first and second sets of process parameters. In some embodiments, the first and second sets of process parameters are selected such that the associated removal map profiles bound the desired removal map profile. That is, the first and second sets of process parameters are selected such that the values associated with the desired removal map profile fall between the values associated with the removal map profiles associated with the first and second sets of process parameters. As an illustrative example, the below Table shows a list of pre-determined process parameter sets and associated pre-determined removal map profiles, represented by global etch rates (i.e., the average rate of silicon removal across the cleaved surface 5 of an SOI structure).

| Parameter Set | H$_2$ Flow Rate (sl/m) | HCl Flow Rate (sl/m) | Susceptor Rotation Speed (RPM) | Etch Rate (Å/s) |
|---|---|---|---|---|
| 0 | 80 | 0.52 | 10 | 4.83 |
| 1 | 80 | 0.52 | 50 | 4.74 |

The illustrative example includes two pre-determined process parameter sets, designated Parameter Set "0" and Parameter Set "1". The parameter sets and the associated removal map profiles may be stored in a library or database, such as the removal map profile library 110 (FIG. 2). In the illustrative example, each process parameter set includes an H$_2$ flow rate, an HCl flow rate, and a susceptor rotation speed. It is understood that, in other embodiments, sets of process parameters may include process parameters other than an H$_2$ flow rate, an HCl flow rate, and a susceptor rotation speed If an incoming SOI structure, such as the incoming SOI structure 108 (FIG. 2), has a desired removal map profile of 4.78 Å/s, none of the pre-determined removal profile maps match the desired removal map profile. However, the desired removal map profile can be achieved using the pre-determined removal map profiles and the pre-determined parameter sets. In particular, Parameter Set "0" and Parameter Set "1" can be combined in a single epi-smoothing process to achieve the desired removal map profile of 4.78 Å/s. For example, Parameter Set "0" is selected for a first portion of the epi-smoothing process and Parameter Set "1" is selected for a second portion of the epi-smoothing portion. The epi-smoothing process is then carried out using the process parameters of Parameter Set "0" for a first portion of the epi-smoothing process, and the process parameters of Parameter Set "1" for a second portion of the epi-smoothing process.

The relative duration for which each process parameter set should be used during the epi-smoothing process can be determined by interpolating or extrapolating the known process parameter sets and/or the known removal map profiles. For example, in the illustrative example, values for the susceptor rotation speed can be interpolated to determine an average susceptor rotation speed for the epi-smoothing process that corresponds to the desired global etch rate of 4.78 Å/s. In the illustrative example, the average susceptor rotation speed that will result in a global etch rate of 4.78 Å/s determined using interpolation is approximately 30 RPM. To achieve an average susceptor rotation speed of 30 RPM for the entire epi-smoothing process, and a global etch rate of approximately 4.78 Å/s, the epi-smoothing process is performed using Parameter Set "0" for 50% of the duration of the epi-smoothing process, and Parameter Set "1" for 50% of the duration of the epi-smoothing process.

In other embodiments, a single set of process parameters for a desired removal map profile may be determined by interpolating and/or extrapolating values of known process parameter sets and/or removal map profiles. That is, a single set of process parameters to be used for the entire duration of an epi-smoothing process can be determined by interpolating and/or extrapolating values of known process parameter sets and/or removal map profiles. In yet other embodiments, known process parameter sets and removal map profiles, such as the removal map profiles 112 and the process parameter sets 114 stored in removal map profile library 110 (all shown in FIG. 2), may be used to create a process "response surface," where the process parameter sets and their resulting removal map profiles are reduced to their functional relationships through a least squares fit approach or other standard mathematical approach. Often, however, process parameters for epi-smoothing processes demonstrate a non-linear relationship with the removal rate of silicon from SOI structures. Thus, using a single process parameter set for an epi-smoothing process determined by interpolation, extrapolation, or other mathematical approach may result in a removal map profile that is significantly different from the desired removal map profile. The method 1100 of FIG. 11 overcomes these issues associated with non-linear process parameter responses by combining two or more pre-determined process parameter sets into a single epi-smoothing process.

The method 1100 may also include updating a removal map profile library with a new removal map profile and an associated set of process parameters. In some embodiments, for example, the method 1100 includes determining a resulting or actual removal map profile for the silicon layer of the SOI structure processed using multiple sets of pre-determined process parameters, and storing the actual removal map profile and the associated multi-set process parameter set in the removal map profile library. Referring again to the above illustrative example, the below table lists a new multi-set process parameter set, designated Parameter Set "0/1", and the resulting removal map profile achieved using the process parameter set. In the illustrative example, the removal map profile achieved using Parameter Set "0/1" was 4.78 Å/s.

| Parameter Set | H$_2$ Flow Rate (sl/m) | HCl Flow Rate (sl/m) | Susceptor Rotation Speed (RPM) | Etch Rate (Å/s) |
| --- | --- | --- | --- | --- |
| 0 | 80 | 0.52 | 10 | 4.83 |
| 1 | 80 | 0.52 | 50 | 4.74 |
| 0/1 | 80 | 0.52 | 50% 10, 50% 50 | 4.78 |

The process parameter sets and removal map profiles provided in the tables above are for illustrative purposes only, and are non-limiting. It is understood that sets of process parameters may include process parameters other than H$_2$ flow rate, HCl flow rate, and susceptor rotation speed, and that removal map profiles may include information other than a global etch rate.

Figure 12:
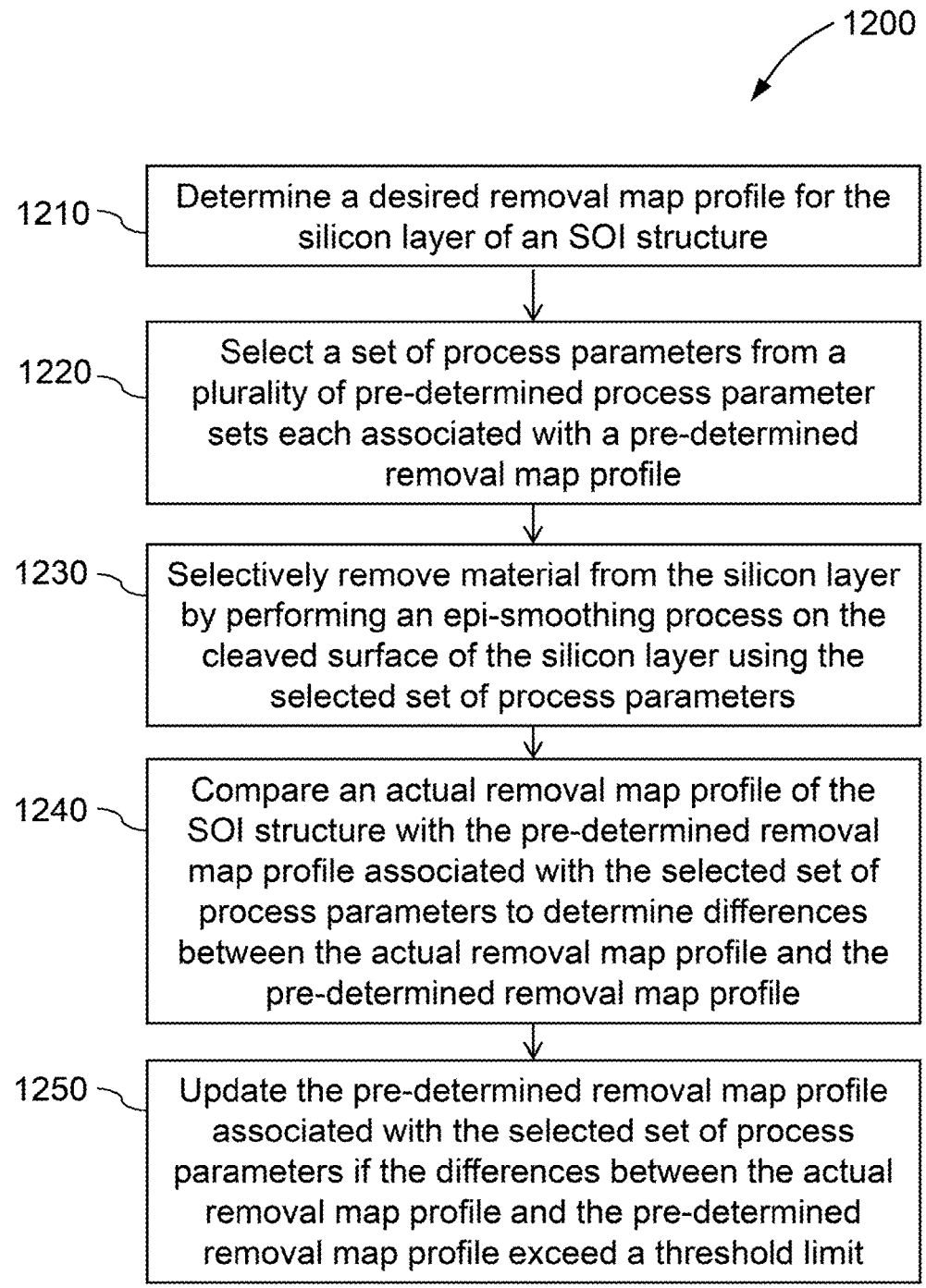
FIG. 12 is a flow chart of another example method for processing the SOI structure of FIG. 1.

FIG. 12 is an example method 1200 for processing the SOI structure 1 of FIG. 1. The method 1100 generally includes determining 1210 a desired removal map profile for the silicon layer 2 of the SOI structure 1, selecting 1220 a set of process parameters from a plurality of pre-determined process parameter sets, each pre-determined process parameter set being associated with a pre-determined removal map profile, selectively removing 1230 material from the silicon layer 2 by performing an epi-smoothing process on the cleaved surface 5 using the selected set of process parameters, comparing 1240 an actual removal map profile of the SOI structure 1 with the pre-determined removal map profile associated with the selected set of process parameters to determine differences between the actual removal map profile and the pre-determined removal map profile, and updating 1250 the pre-determined removal map profile associated with the selected set of process parameters used during the epi-smoothing process if the differences between the actual removal map profile and the pre-determined removal map exceed a threshold limit.

The method 1200 of FIG. 12 is particularly suitable for use with a removal map profile library, such as the removal map profile library 110 of FIG. 2, in which the pre-determined process parameter sets and the pre-determined removal map profiles are stored. In particular, the conditions of the wafer processing device used to process SOI structures may vary or "drift" over time, resulting in different removal map profiles for SOI structures processed under the same set of process parameters. For example, the heating elements 322 (shown in FIG. 3) used to heat the CVD reactor 300 may distribute heat differently across the CVD reactor 300 as the heating elements 322 age. As a result, the actual removal map profile of an SOI structure processed using one of the pre-determined process parameter sets may vary from the expected removal map profile (i.e., the pre-determined removal map profile associated with the pre-determined process parameter set used to process the SOI structure). The method 1200 of FIG. 12 facilitates minimizing the effects of CVD reactor drift on the wafer-to-wafer and within-wafer thickness uniformity for SOI structures processed using an epi-smoothing process.

The steps of determining 1210 a desired removal map profile, selecting 1220 a set of process parameters, and selectively removing 1230 material from the silicon layer 2 may be carried out in substantially the same manner as described above with reference to FIGS. 9 and 10.

Comparing 1240 an actual removal map profile of the SOI structure 1 with the pre-determined removal map profile includes determining the actual removal map profile of the SOI structure 1. The actual removal map profile of the SOI structure 1 may be determined, for example, by measuring the pre-epi-smoothing thickness profile of the SOI structure (specifically, the silicon layer 2 of the SOI structure), measuring the post-epi-smoothing thickness profile of the SOI structure, and subtracting the post-epi-smoothing thickness profile from the pre-epi-smoothing thickness profile. The pre- and post-epitaxial thickness profiles may be measured using, for example and without limitation, the wafer measuring device 102 described above with reference to FIG. 2.

In some embodiments, comparing 1240 the actual removal map profile with the pre-determined removal map profile includes comparing silicon removal values associated with each of the actual removal map profile and the pre-determined removal map profile. In one embodiment, for example, each removal map profile includes a plurality of silicon removal values, where each silicon removal value represents an actual or expected amount of silicon removal (e.g., in Angstroms) from the silicon layer at a specific location on the silicon layer. Corresponding silicon removal values from the actual removal map profile and the pre-determined removal map profile (i.e., the silicon removal values associated with the same location on a silicon layer) may be subtracted from one another to compare the actual removal map profile with the pre-determined removal map profile. Comparing 1240 the actual removal map profile with the pre-determined removal map profile may be performed using a computing device, such as the computing device 106 described above with reference to FIG. 2.

In addition to or as an alternative to comparing 1240 the actual removal map profile with the pre-determined removal map profile, the method 1200 may also include comparing the actual thickness profile of an SOI structure with the expected thickness profile of an SOI structure.

Updating 1250 the pre-determined removal map profile may include manually updating the removal map profile, or automatically updating the removal map profile using, for example, the computing device 106 (FIG. 2). In some embodiments, for example, a user may manually compare the actual and expected removal map profiles for an SOI structure (or the actual and expected thickness profiles) and, where the differences between the actual and expected removal map profiles exceed a threshold limit, update the pre-determined removal map profile. The pre-determined removal map profile may be updated by modifying the pre-determined removal map profile, or by replacing the pre-determined removal map profile with the actual removal map profile.

In other embodiments, a computing device, such as the computing device 106 (FIG. 2), automatically compares the actual and expected removal map profiles for an SOI structure (or the actual and expected thickness profiles) and, if the differences between the actual and expected removal map profiles exceed a threshold limit, outputs a notification or alert to a user (e.g., an audio or visual notification) indicating that the differences between the actual removal map profile and the expected removal map profile exceed the threshold limit. The user may then evaluate the SOI structure and/or the processing history of the wafer processing device used to process the SOI structure to determine if the wafer processing device requires maintenance and/or if the pre-determined removal map profile should be updated. In yet other embodiments, a computing device, such as the computing device 106 (FIG. 2), automatically updates the pre-determined removal map profile if the differences between the actual and expected removal map profiles exceed a threshold limit.

Where the pre-determined removal map profile is stored in a library, such as the removal map profile library (FIG. 2), updating 1250 the pre-determined removal map profile may include modifying or replacing the removal map profile associated with the process parameter set used to process the SOI structure. In one embodiment, for example, updating 1250 the pre-determined removal map profile includes replacing the pre-determined removal map profile with the actual removal map profile (e.g., by storing the actual removal map profile in the removal map profile library). In other embodiments, updating 1250 the pre-determined removal map profile may include determining a new removal map profile by conducting one or more epi-smoothing processes on test wafers using, for example, the set of process parameters associated with the pre-determined removal map profile.

The threshold limit used to determine if the pre-determined removal map profile should be updated may be any suitable threshold that enables the method 1200 to be carried out as described herein. In some embodiments, the threshold limit may be a maximum difference between the silicon removal values of the actual and expected removal map profile.

The systems and methods described herein facilitate production of semiconductor structures, such as SOI structures, with semiconductor device layers (e.g., top silicon layers) having highly uniform thickness profiles. In particular, the systems and methods described herein facilitate determining a removal map profile to be applied to the device layer (e.g., the top silicon layer of an SOI structure) to achieve a highly uniform thickness profile, and determining a set of process parameters to be used in an epi-smoothing process to obtain the desired removal map profile. In some embodiments, for example, a removal map profile library is utilized to determine a set of process parameters for use in an epi-smoothing process by identifying a pre-determined removal map profile that substantially matches a desired removal map profile, and selecting a pre-determined process parameter set associated with the pre-determined removal map profile. Utilizing pre-determined removal map profiles and associated process parameter sets enables targeted processing of individual semiconductor structures, while reducing or eliminating waste associated with using test wafers to determine process parameters for each individual semiconductor structure.

Moreover, the systems and methods described herein enable the desired removal map profile to be selected based on the pre-epi-smoothing thickness profile of a semiconductor structure and/or based on post-epi-smoothing processes that have a known or predictable effect on the thickness uniformity of the semiconductor structure such that the final semiconductor structure has a substantially uniform thickness profile, even when one or more post-epi-smoothing processes are carried out on the semiconductor structure.

Further, in some embodiments, two or more process parameter sets each associated with a known removal map profile are combined in a single epi-smoothing process to achieve a desired removal map profile that is different from the known removal map profiles. Using multiple sets of process parameters in single epi-smoothing process, or multi-set processing, often provides more predictable and more accurate removal map profiles as compared to using a single set of process parameters determined using mathematical methods or models (e.g., by interpolation).

Additionally, the systems and methods described herein facilitate minimizing the effects of CVD reactor drift on the thickness uniformity of semiconductor structures by updating pre-determined removal map profiles when discrepancies between the actual and the expected removal map profiles are detected. Moreover, in some embodiments, the systems and methods described herein facilitate predicting or estimating when equipment used to process semiconductor structures, such as CVD reactors, will need maintenance, thereby facilitating management of the overall semiconductor manufacturing process.

The term processor, as used herein, refers to central processing units, microprocessors, microcontrollers, reduced instruction set circuits (RISC), application specific integrated circuits (ASIC), logic circuits, and any other circuit or processor capable of executing the functions described herein.

As used herein, the terms "software" and "firmware" are interchangeable, and include any computer program stored in memory for execution by a processor including RAM memory, ROM memory, EPROM memory, EEPROM memory, and non-volatile RAM (NVRAM) memory. The above memory types are exemplary only, and are thus not limiting as to the types of memory usable for storage of a computer program.

As will be appreciated based on the foregoing specification, the above-discussed embodiments of the disclosure may be implemented using computer programming or engineering techniques including computer software, firmware, hardware or any combination or subset thereof. Any such resulting computer program, having computer-readable and/or computer-executable instructions, may be embodied or provided within one or more computer-readable media, thereby making a computer program product, i.e., an article of manufacture, according to the discussed embodiments of the disclosure. These computer programs (also known as programs, software, software applications or code) include machine instructions for a programmable processor, and can be implemented in a high-level procedural and/or object-oriented programming language, and/or in assembly/machine language. As used herein, the terms "machine-readable medium," "computer-readable medium," and "computer-readable media" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium," "computer-readable medium," and "computer-readable media," however, do not include transitory signals (i.e., they are "non-transitory"). The term "machine-readable signal" refers to any signal used to provide machine instructions and/or data to a programmable processor.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method for processing a silicon-on-insulator structure comprising a handle wafer, a silicon layer, and a dielectric layer between the handle wafer and the silicon layer, the silicon layer having a cleaved surface defining an outer surface of the structure, the method comprising:
    measuring an initial thickness profile of the silicon layer;
    determining a desired removal map profile for the silicon layer of the silicon-on-insulator structure by determining a removal map profile that is complementary to the initial thickness profile of the silicon layer;
    determining a set of process parameters for use in a gaseous etchant epitaxial smoothing process based on the desired removal map profile, wherein determining a set of process parameters includes selecting, based on the desired removal map profile, the set of process parameters from a plurality of pre-determined process parameter sets, each pre-determined process parameter set associated with a pre-determined removal map profile; and
    selectively removing material from the silicon layer according to the removal map profile by performing an epitaxial smoothing process on the cleaved surface using the determined set of process parameters, wherein the epitaxial smoothing process includes contacting the cleaved surface with a gaseous etchant.

2. The method of claim 1, wherein the determined set of process parameters includes a gaseous etchant flow rate and a hydrogen gas flow rate, wherein selectively removing material from the silicon layer includes:
    controlling a flow rate of the gaseous etchant according to the determined set of process parameters; and
    controlling a flow rate of hydrogen gas according to the determined set of process parameters.

3. The method of claim 1, wherein the epitaxial smoothing process includes positioning the silicon-on-insulator structure on a rotatable susceptor within a wafer processing device, the determined set of process parameters including a susceptor rotation speed and a position of the silicon-on-insulator structure relative to a rotational axis of the susceptor, wherein selectively removing material from the silicon layer includes controlling a rotation speed of the susceptor according to the determined set of process parameters, and wherein positioning the silicon-on-insulator structure on the rotatable susceptor includes positioning the silicon-on-insulator structure at the position.

4. The method of claim 1, wherein the epitaxial smoothing process includes positioning the silicon-on-insulator structure within a wafer processing device including a gas manifold defining a plurality of gas injection flow paths, wherein selectively removing material from the silicon layer includes controlling a relative gas flow rate through each of the gas injection flow paths according to the determined set of process parameters.

5. The method of claim 1 further comprising:
comparing an actual removal map profile of the silicon-on-insulator structure with the pre-determined removal map profile associated with the selected set of process parameters used during the epitaxial smoothing process to determine differences between the actual removal map profile and the pre-determined removal map profile; and
updating the pre-determined removal map profile associated with the selected set of process parameters used during the epitaxial smoothing process if the differences between the actual removal map profile and the pre-determined removal map profile exceed a threshold limit.

6. The method of claim 1, wherein determining a set of process parameters includes determining a first set of process parameters for a first portion of the epitaxial smoothing process, and determining a second set of process parameters for a second portion of the epitaxial smoothing process.

7. The method of claim 6, wherein selectively removing material from the silicon layer includes performing the epitaxial smoothing process on the cleaved surface using the first set of process parameters for the first portion of the epitaxial smoothing process and the second set of process parameters for the second portion of the epitaxial smoothing process.

8. The method of claim 2, wherein the gaseous etchant is hydrogen chloride.

9. A system for processing a silicon-on-insulator structure comprising a handle wafer, a silicon layer, and a dielectric layer between the handle wafer and the silicon layer, the silicon layer having a cleaved surface defining an outer surface of the structure, the system comprising:
a wafer measuring device configured to measure a thickness profile of the silicon layer;
a wafer processing device;
a computing device communicatively connected to the thickness measuring device, the computing device configured to:
determine a desired removal map profile for the silicon layer of the silicon-on-insulator structure based on the thickness profile of the silicon layer; and
determine a set of process parameters for use in a gaseous etchant epitaxial smoothing process based on the desired removal map profile; and
a removal map profile library communicatively connected to the computing device, the removal map profile library including a plurality of pre-determined removal map profiles and a plurality of pre-determined process parameter sets, each pre-determined removal map profile associated with one of the pre-determined process parameter sets;
wherein the computing device determines the set of process parameters by selecting, based on the desired removal map profile, the set of process parameters from the plurality of pre-determined process parameter sets; and
wherein the wafer processing device is configured to selectively remove material from the silicon layer according to the removal map profile by performing a gaseous etchant epitaxial smoothing process on the cleaved surface using the determined set of process parameters.

10. The system of claim 9, wherein the wafer processing device includes a gas injection port connected in fluid communication with a source of gaseous etchant, the wafer processing device fluidly connected to a source of hydrogen gas, wherein the determined set of process parameters includes a gaseous etchant flow rate and a hydrogen gas flow rate, the wafer processing device configured to:
control a flow rate of the gaseous etchant according to the determined set of process parameters to selectively remove material from the silicon layer; and
control a flow rate of the hydrogen gas according to the determined set of process parameters to selectively remove material from the silicon layer.

11. The system of claim 10, wherein the gaseous etchant is hydrogen chloride.

12. The system of claim 9, wherein the wafer processing device includes a rotatable susceptor, the determined set of process parameters including a susceptor rotation speed, wherein the wafer processing device is configured to control a rotation speed of the susceptor according to the determined set of process parameters.

13. The system of claim 9, wherein the wafer processing device includes a gas manifold defining a plurality of gas injection flow paths, the wafer processing device configured to control a relative gas flow rate through each of the gas injection flow paths according to the determined set of process parameters.

14. The system of claim 9, wherein the computing device is configured to:
compare an actual removal map profile of the silicon-on-insulator structure with the pre-determined removal map profile associated with the selected set of process parameters used during the epitaxial smoothing process to determine differences between the actual removal map profile and the pre-determined removal map profile; and
initiate an update event if the differences between the actual removal map profile and the pre-determined removal map profile exceed a threshold limit.

15. The system of claim 14, wherein the computing device is configured to initiate an update event by outputting a notification indicating that the differences between the actual removal map profile and the pre-determined removal map profile exceed the threshold limit.

16. The system of claim 14, wherein the computing device is configured to update the removal map profile library by storing the actual removal map profile in the removal map profile library such that the actual removal map profile is associated with selected set of process parameters.

17. The system of claim 9, wherein the computing device is configured to:
select a first set of process parameters from the plurality of pre-determined process parameter sets for use during a first portion of the epitaxial smoothing process; and
select a second set of process parameters from the plurality of pre-determined process parameter sets for use during a second portion of the epitaxial smoothing process;
wherein the wafer processing device is configured to perform the epitaxial smoothing process on the cleaved surface using the first set of process parameters for the first portion of the epitaxial smoothing process and the second set of process parameters for the second portion of the epitaxial smoothing process.

* * * * *